United States Patent [19]

Pickering et al.

[11] Patent Number: 5,129,956
[45] Date of Patent: Jul. 14, 1992

[54] METHOD AND APPARATUS FOR THE AQUEOUS CLEANING OF POPULATED PRINTED CIRCUIT BOARDS

[75] Inventors: Raymond E. Pickering, Vassalboro, Me.; Patricia E. Waitkus, Rockport, Mass.; Delmar R. Parsons, Greenfield, Mass.; Lincoln Soule, Wendell, Mass.; William T. Walker, South Deerfield, Mass.; Robert E. Bedaw, Turner Falls, Mass.

[73] Assignee: Digital Equipment Corporation, Maynard, Mass.

[21] Appl. No.: 417,937

[22] Filed: Oct. 6, 1989

[51] Int. Cl.$^5$ .................. B08B 1/02; B08B 3/02; B08B 11/02
[52] U.S. Cl. .................. 134/15; 134/25.4; 134/32; 134/38; 134/26; 134/72; 134/130; 134/67; 134/151; 134/152; 134/184; 134/129; 134/902
[58] Field of Search .......... 134/15, 25.4, 32, 38, 134/72, 130, 67, 151, 152, 184, 26, 129, 902

[56] References Cited

U.S. PATENT DOCUMENTS

| | | | |
|---|---|---|---|
| 2,804,341 | 8/1957 | Bete | 239/501 |
| 3,177,095 | 4/1965 | Gibson | 134/25.2 |
| 3,432,346 | 3/1969 | Hurst | 134/32 |
| 3,483,616 | 12/1969 | Shomphe | 29/853 |
| 3,755,886 | 9/1973 | Hermann | |
| 3,868,272 | 2/1975 | Tardoskegyi | 134/32 |
| 4,102,350 | 7/1978 | Chelton et al. | 134/130 |
| 4,342,425 | 8/1982 | Vickers | 134/38 |
| 4,537,639 | 8/1985 | Shook | 134/10 |

FOREIGN PATENT DOCUMENTS 2197581 5/1988 United Kingdom .................. 134/15

OTHER PUBLICATIONS

"Aqueous Cleaning Power" by Janet R. Sterritt, from Printed Circuit Assembly Magazine, Sep., 1989 issue at pp. 26-29.

Primary Examiner—Theodore Morris
Assistant Examiner—Zeinab El-Arini
Attorney, Agent, or Firm—Cesari & McKenna

[57] ABSTRACT

A method and apparatus for the aqueous cleaning of a printed circuit board having surface mounted components assembled thereon. The invention involves a heated aqueous solution sprayed under high pressure through a helically-vaned nozzle that is moving rotationally about the plane of a moving printed circuit board. The apparatus accomplishes a thorough cleaning of all components and areas of the printed circuit board with the use of a water based cleaning solution.

14 Claims, 6 Drawing Sheets

METHOD AND APPARATUS FOR THE AQUEOUS CLEANING OF POPULATED PRINTED CIRCUIT BOARDS

FIELD OF THE INVENTION

This invention relates to a method and apparatus for the cleaning of printed circuit boards and more particularly, to a method and apparatus for cleaning printed circuit boards having closely spaced components mounted thereon by use of a water based cleaning solution.

BACKGROUND OF THE INVENTION

Throughout contemporary manufacturing, there are myriad occasions when products must be scrupulously cleaned of various deleterious materials prior to further processing or use. In the area of electronics manufacturing, those unwanted materials may be the masking chemicals or soldering flux residue materials common to printed circuit board production and assembly. When the problem of cleaning is aggravated by the irregularities of components assembled to a board and the close spacing of the mounted components, special cleaning devices, solutions and processes are needed.

The traditional means of cleaning such assembled printed circuit boards is by way of various chlorinated hydrocarbon or chlorofluorocarbon based solvents. These solvents are recognized today to be undesirable because of the various health and environmental hazards they create, most particularly the threat to the Earth's protective ozone layer. In contemporary society, more and more stress is being placed on solving problems attendant to environmental protection, and thus, the drive to substitute environmentally neutral manufacturing processes escalates.

Attempts have been made to utilize water as a solution in cleaning printed circuit boards. In the traditional water-cleaning processes, when water is sprayed angularly at the surface of a printed circuit board, the water bounces off. This means that only the spot actually impacted by the water spray is cleaned, and the rest of the surface is merely wetted. When components are added to the board so that it becomes important or necessary to remove tough and tenacious residue from under these components, this "spray-and-bounce" method is especially ineffective. If the water is sprayed vertically downward, it's momentum is dissipated as the stream impacts the surface and the flow direction is abruptly changed. The resultant sideward flow lacks the force necessary to dislodge flux residue in small spaces.

U.S. Pat. No. 3,868,272, issued Feb. 25, 1975 to Tardoskegyi, entitled CLEANING OF PRINTED CIRCUIT BOARDS BY SOLID AND COHERENT JETS OF CLEANING LIQUID discloses a process of cleaning a liquid flux from the surface of a printed circuit board having components mounted thereon using through-hole technology. Tardoskegyi utilizes a plurality of closely spaced nozzles for directing high velocity jets of cleaning liquid perpendicularly against the entire upper and lower surfaces of a printed circuit board.

With the technology utilized in electronic device assembly today, particularly in computer devices, lead length between components has been shortened, resulting in greater density of mounted components on printed circuit board substates, thus creating a tightly crowded, difficult to clean assembly.

One recent manufacturing development that has enabled dense packaging is the surface mounting of components upon printed circuit boards. Surface mount technology was developed in response to the need to connect components with lead spacing closer than was practical with conventional through-hole techniques. This technology also allows for the mounting of discrete, leadless devices which have very small clearance between their lower surfaces and the adjacent surface of the printed circuit board to which they are mounted. The surface mount approach solves the problem of drilling tightly spaced holes into the printed circuit board and allows closer component placement, but requires the use of a solder flux in a paste form rather than liquid form. Frequently, the paste flux will contain the solder in suspension.

During the assembly process, when the printed circuit board with surface mounted components is exposed to heat to melt and flow the solder, the flux paste tends to polymerize into a firm resinous material. The removal of this material is difficult, but essential. Unless complete cleaning is accomplished, electrical failure in the form of short circuits is much more likely due to the fact that the flux includes droplets of solder, which is conductive. Alternatively, the hardened flux residue, if not totally removed, can serve as an insulating layer to block conductive portions of the electrical circuit from contact by a test probe, thereby interfering with necessary testing of the printed circuit board assembly.

Therefore, in accordance with an aspect of the present invention, a feature is to provide a new and improved method and apparatus for cleaning the surfaces of printed circuit boards with sufficient effectiveness to dislodge and remove hardened and trapped particulate matter of the paste flux resulting from a surface mount process.

In accordance with another aspect of the present invention, a feature is to provide a new and improved method and apparatus for cleaning the surfaces of printed circuit boards with the use of water or a water based cleaning solution.

SUMMARY OF THE INVENTION

The foregoing and other objects of the invention are accomplished by the utilization of a combination of cone-shaped spray geometry, definable by such characteristics as droplet size, spray density, and angle of incidence, together with rotational velocity, and high pressure and temperature solution to achieve a uniquely successful cleaning result. In general, a heated aqueous solution, which may include process enhancing additives, is sprayed under high pressure through a helically-vaned nozzle that is moving rotationally about the plane of a moving printed circuit board, thereby accomplishing the thorough cleaning of all components and areas of the board.

Other objects, features and advantages of the invention will become apparent from a reading of the specification when taken in conjunction with the drawings, in which like reference numerals refer to like elements in the several views.

DESCRIPTION OF THE PREFERRED EMBODIMENTS

Figure 1:
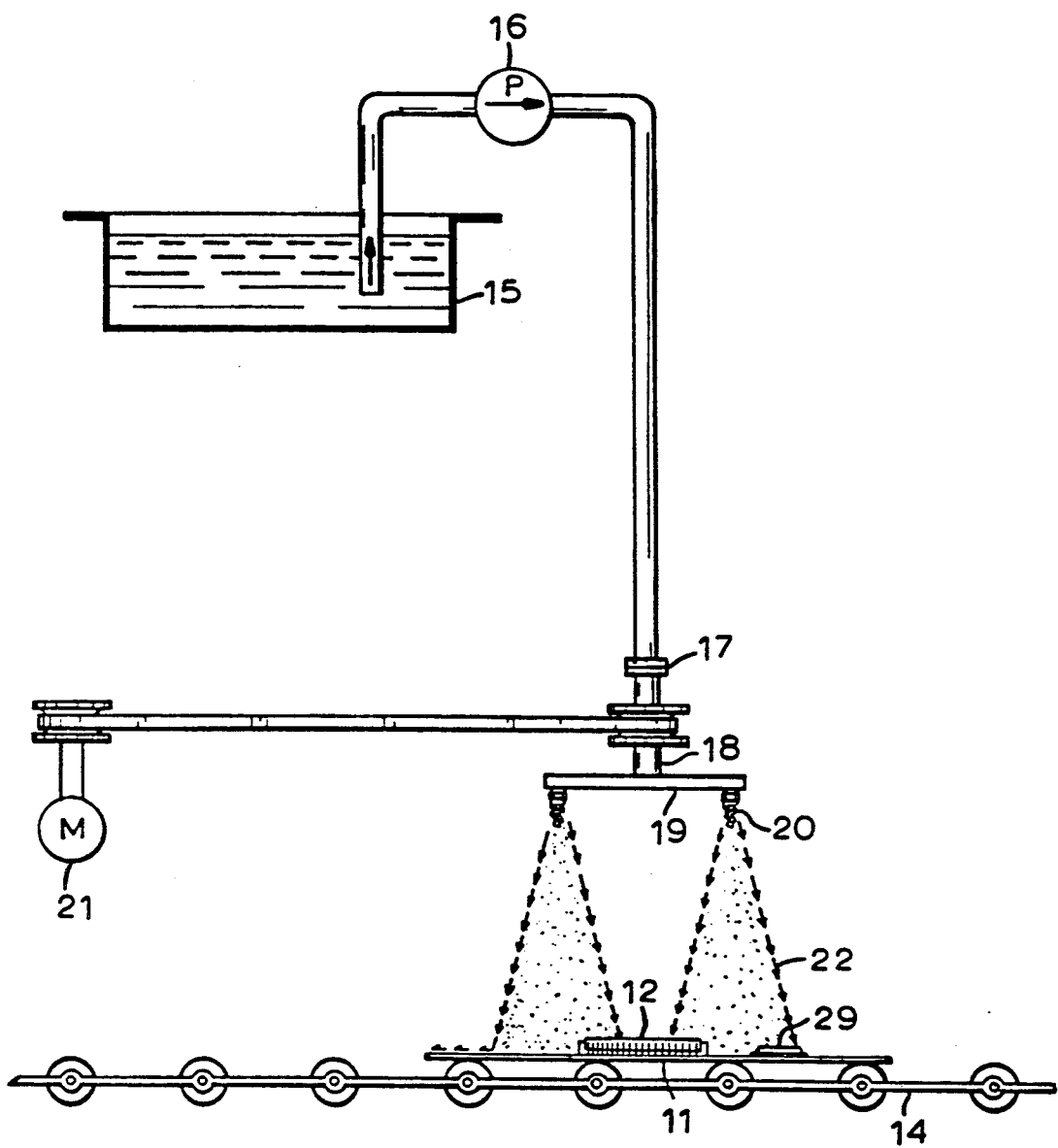
FIG. 1 is a side elevational view of the printed circuit board cleaning apparatus in accordance with the invention.
Figure 2:
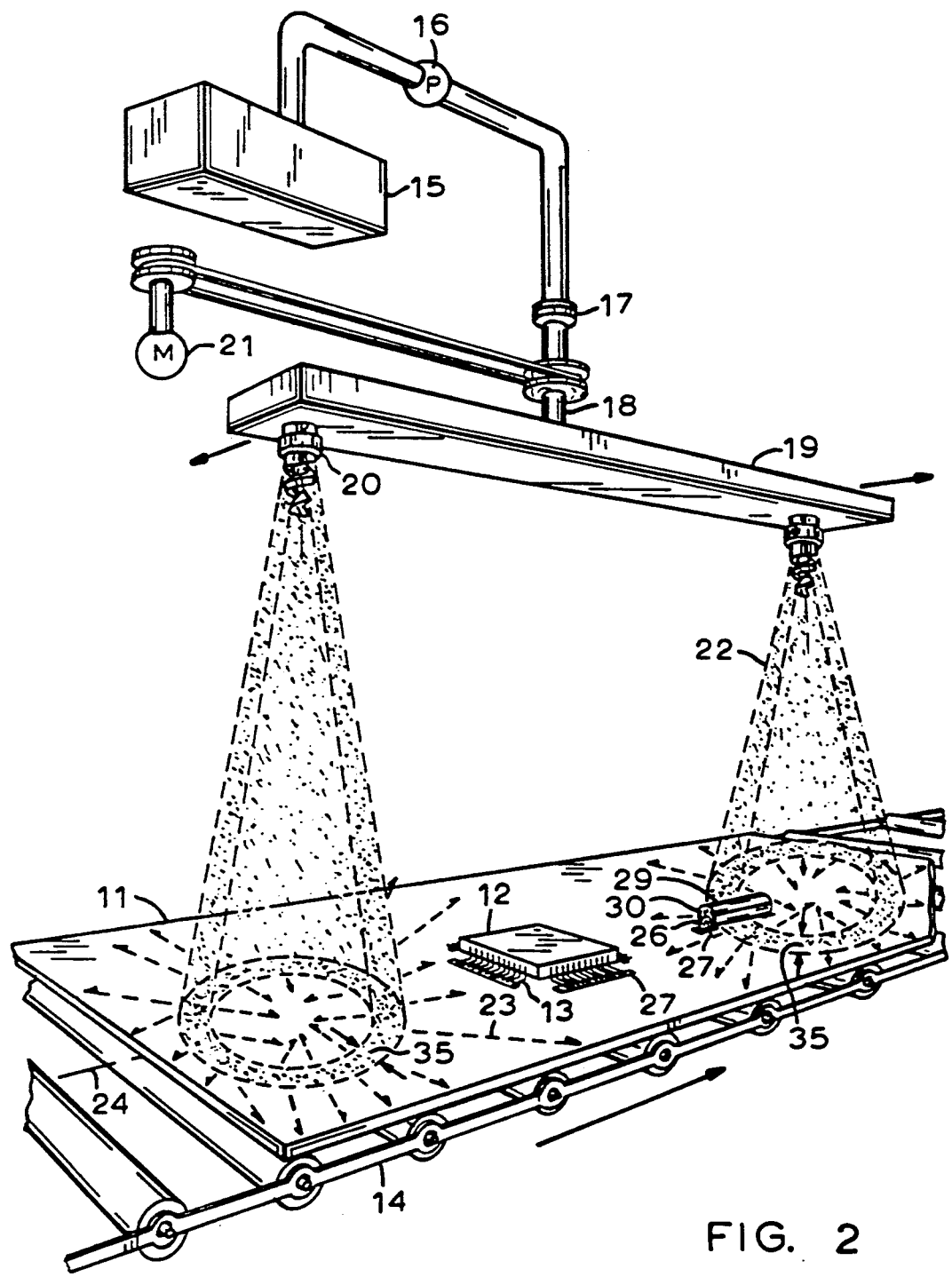
FIG. 2 is a perspective view of the printed circuit board cleaning apparatus of FIG. 1, wherein the printed circuit board in the drawing has been shown in a non-parallel relation to the solution delivery manifold for ease of depiction.

Referring now to the drawings, and particularly to FIGS. 1 and 2, a printed circuit board 11 has integrated circuit components 12 and discrete components 29 mounted thereon. The integrated circuit components 12 each have a plurality of electrically conductive leads 13 emanating from the side panels thereof, the leads 13 having been attached to the printed circuit board 11 by conventional surface mount techniques. The discrete components 29, on the other hand, have metal ends 30, not leads, terminating the ends thereof, the metal ends 30 having also been attached to printed circuit board 11 by known surface mount techniques. The printed circuit board 11 is of the conventional type, that is, a two sided, generally planar plate shaped member consisting of an insulative substrate having conductive lamina surfaces on opposite surfaces thereof, with selected portions of the conductive lamina removed to define conductive paths between the various components assembled thereon. The board 11 may also have numerous internal conductive and non-conductive layers sandwiched between the outer, opposite surfaces on which components 12 and 29 are mounted.

In accordance with surface mounting techniques, by reference also to FIGS. 4, 5, and 6, the conductive portions define pads 27 on which the leads 13 of integrated circuit components 12 and ends 30 of discrete components 29 are positioned, and, as part of such assembly, a solder flux paste 26 is applied and subsequently becomes hardened by exposure of the board 11 and assembled components to heat, which is necessary to melt and flow the solder.

The process of surface mounting of discrete components 29 to the printed circuit board 11 will typically result in spacing between the lower surface of component 29 and the adjacent surface of board 11 of small dimensions which, by way of example, is in the order of 0.004". Although the spacing between the lower surface of integrated circuit component 12 and the adjacent surface of board 11 is approximately 0.050", the spacing between adjacent leads 13 of integrated circuit 12 may result in dimensions in the order of 0.006". These extremely small areas are prone to entrap hardened solder flux. These areas are also typically beneath the infiltration threshold of cleaning solutions in prior processes. Nevertheless, the combination defined herein provides a means for quality cleaning of such surface mounted printed circuit boards without the use of objectionable solvents.

Figure 3:
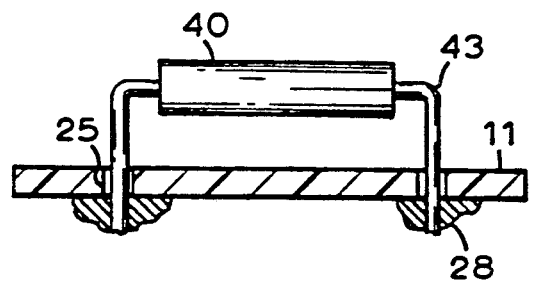
FIG. 3 is an enlarged sectional view of a printed circuit board with a typical component assembled thereto by the traditional through hole process.

Referring now to FIG. 3, and by way of contrast, a traditional through hole mounting technique is depicted, and, as shown, the resulting spacing between typical component 40 and board 11 is relatively large. The process is based on the drilling of hole 25 in board 11 and passing leads 43 there in, thereafter causing predeposited solder 28 to melt and to create a mechanical bond and electrical connection between leads 43 and the circuit pattern laminated to board 11. As component 40 is placed upon printed circuit board 11 with leads 43 in the holes 25, relative movement is not likely and the use of a liquid solder flux is satisfactory. Consequently, the flux does not harden after soldering and is not difficult to remove by conventional washing or cleaning techniques, which reach most areas that require cleaning since these areas are exposed and accessible.

Figure 4:
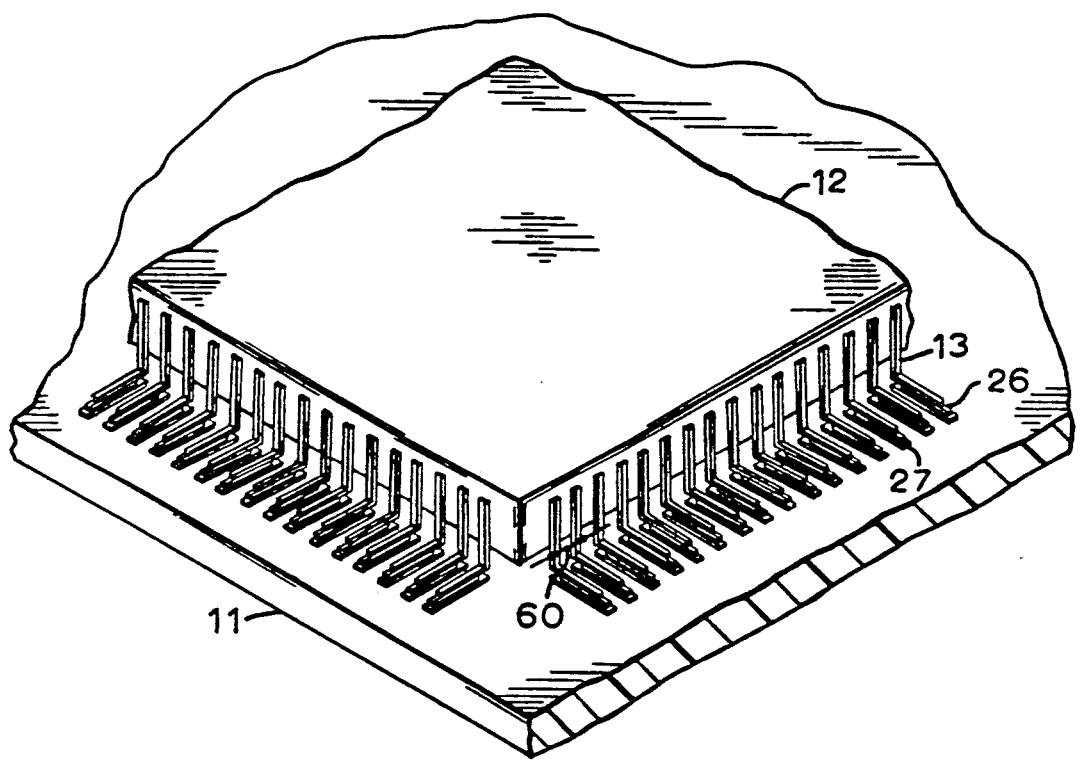
FIG. 4 is a perspective view of a printed circuit board with an integrated circuit component having outside leads assembled thereto by a surface mounting process.

As shown in FIG. 4, one style of a surface mounted technique is depicted in which the leads 13 of integrated circuit component 12 emanate from the side panels of integrated circuit 12 and pass downwardly to a point where they are redirected outwardly in a plane parallel to the major surfaces of component 12 (known as a gull-wing leaded component). The printed circuit board 11 is laminated with lead mounting pads 27 onto which the leads 13 of integrated circuit component 12 are placed, without the aid of through holes. To assure that the integrated circuit 12 does not significantly move during handling and processing, a flux in a paste form is used, rather than a liquid, the paste 26 having somewhat adhesive characteristics to enable positioning and retention of the component 12 during assembly of all integrated circuit components 12 onto the surface of the printed circuit board 11. The flux paste 26 is typically mixed to include the solder so as to avoid the need for an extra step.

After all components have been assembled on the surface of the printed circuit board 11 by use of the adhesive qualities of the flux paste 26, the assembly is then exposed to heat to permanently bond the component leads 13 to the pads 27. In the exposure to heat, which must be in excess of 361° F. and for a duration of sixty to ninety seconds, the solder in paste 26 will melt to connect the leads 13 of the integrated circuit 12 to board 11. Simultaneously, the paste 26 will cure or harden, creating a residue that is difficult to remove from a small space, for example, space 60 between adjacent leads 13. As previously mentioned, the dimension of space 60 may be in the order of 0.006".

Figure 5:
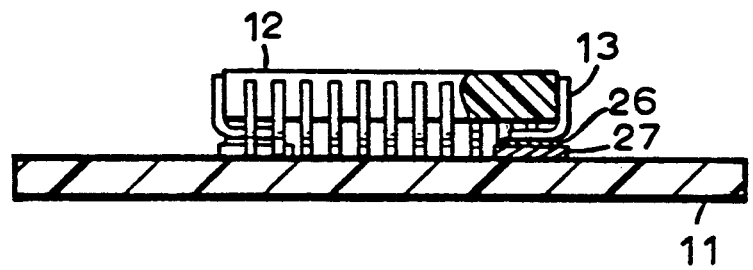
FIG. 5 is an enlarged sectional view of a printed circuit board with an integrated circuit component having underneath leads assembled thereto by a surface mounting process.

FIG. 5 illustrates an alternate style of surface mounted technique which enables closer spacing between adjacent components. In this method, the integrated circuit component 12 has leads 13 that emanate from the sides of the integrated circuit 12 and pass downwardly to a point, at least to the lowest level of integrated circuit 12 where they are redirected under the component 12, that is, inwardly along and beneath the lower surface of the integrated circuit component 12 or slightly spaced therefrom (known as J-bend leaded component). The assembly and soldering process as described in FIG. 4 is then performed. While the space between the lower surface of integrated circuit 12 and the adjacent surface of the board 11 is greater than the spacing of the outwardly disposed leads 13 of the integrated circuit component 12 of FIG. 4, the spacing between adjacent leads 13 remains small and shelters small spaces from easy cleaning.

Figure 6:
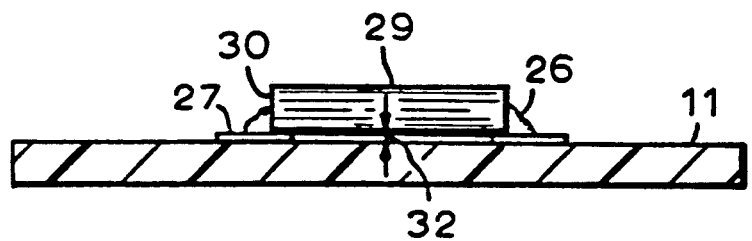
FIG. 6 is an enlarged sectional view of a printed circuit board with a discrete, leadless component assembled thereto by a surface mounting process.

FIG. 6 shows an additional surface mounted technique in which the metal ends 30 of the discrete, leadless component 29 are soldered directly to mounting pads 27, without any additions or alterations to the ends 30. Accordingly, the resulting space 32 between the lower surface of discrete component 29 and the adjacent surface of printed circuit board 11 is in the order of 0.004", which is much smaller than that of integrated circuit components 12 of FIGS. 4 and 5.

When using surface mounted technology and either of the component assembly configurations of FIGS. 4, 5, or 6, the spacing 60 between adjacent leads 13 on the same integrated circuit component 12 are very small, while the spacing 32 between the lower surface of discrete component 29 and the adjacent surface of the printed circuit board 11 is likewise very small. In any case, the spacing between leads 13 and ends 30 on adjacent components are very small. Such close tolerances and spacing create major hurdles to the use of conventional cleaning techniques in the removal of particulate residue of the solid matter remaining after the assembly and heating process.

In accordance with the present embodiment of the invention, and referring again to FIGS. 1 and 2, the cleaning apparatus includes a liquid reservoir 15, from which a solution is transported by a pump 16 through tubing to a rotatable delivery manifold 19, which is of a generally elongate configuration rotatable about its approximate geometrical center, defined by inlet 18, by means of a motor arrangement 21. Affixed to the underside of opposite ends of the manifold 19 are first and second nozzles 20, each of which is substantially equidistant from the axis of rotation of the manifold 19. The manifold 19 is configured, dimensioned and arranged to rotate in a plane generally parallel to the plane of the printed circuit board 11, that is, in a plane generally parallel to the plane of the conveyor 14. The manifold 19 could be constructed as an arm which supplies structured support and movement to nozzles 20 and the solution could be delivered to the nozzles 20 via ducts or tubes, if desired.

The printed circuit board 11, with components 12 and 29 mounted thereon by use of the flux paste 26, is transported in a plane perpendicular to the axis of rotation of the manifold 19 by means of a conveyor 14 of conventional construction. The conveyor 14 transports the component-assembled printed circuit board 11 along a path generally coinciding with the center line 24 of the apparatus. The conveyor 14 is constructed and operated to move one or more printed circuit boards 11 past one or more stations in the manufacturing process which may include the steps of heat/solder, wash, rinse, and dry.

The spacing in the vertical direction between the lowest point of the nozzles 20 and the plane of the printed circuit board 11 is chosen to provide the optimum cleaning fluid force at the printed circuit board 11 in the flow pattern desired, as will be hereinafter described. The liquid reservoir 15 and pump 16 may be physically located in any convenient location. In accordance with the invention, the reservoir 15 includes a heating device or structure (not shown) for providing a heated aqueous solution for use in the printed circuit board cleaning process. In addition, the pump 16 is capable of delivering fluid at a high pressure through the manifold 19 and nozzle 20 assembly. Alternatively, a cleaning fluid may be supplied to the nozzles 20 by whatever means desired.

As presently embodied, the cleaning apparatus obtains the solution from heating reservoir 15 through suitable piping to a high pressure pump 16, which pumps the solution at a pre-selected high pressure, in the range of 250 to 500 psi, through a suitable rotatable pressure seal 17 into inlet 18 to manifold 19 to discharge through one or more nozzles 20. The heating reservoir 15 is capable of maintaining the solution at a temperature of between 140° F. and 160° F., with the reservoir 15 having sufficient capacity to heat the quantity of solution passing through the washing process. The manifold 19 is caused to oscillate or rotate about the inlet 18 by any suitable means, such as a motor, pulley and drive belt arrangement 21, at a rotational or oscillational speed of between fifteen and thirty rpm. A direct drive gear motor configuration could also be used. During this rotation, the heated solution is sprayed upon the printed circuit board 11 through nozzles 20, which are of a helically-vaned type design.

In accordance with the invention, the helically-vaned nozzle 20 is configured for producing a cone-shaped spray stream 22 of highly atomized droplets, the spray stream 22 having an included angle of between 50° and 90°, that is 25° to 45° to the axis of the cone-shaped stream 22. Other angles could, of course, be used without deviating from the inventive concepts described herein as would be apparent to one of ordinary skill in the art. Below, Tables 1-4 summarize composite droplet size testing results of spray stream 22 produced by helically-vaned nozzle 20.

TABLE 1

|  | TESTS: | | | |
|---|---|---|---|---|
|  | 1A | 1B | 1C | 1D |
| PRESSURE (PSI): | 200 | 200 | 200 | 200 |
| CENTERLINE (INCHES): | 4.0 | 4.0 | 4.0 | 4.0 |
| RADIUS (INCHES): | 2.0 | 1.0 | 1.5 | 1.5 |
| AZIMUTHAL ANGLE (%): | 26.6 | 14.0 | 20.6 | 20.6 |
| CYLINDRICAL ANGLE (%): | 0 | 180 | 90 | 270 |

| DIAMETER (microns) | DROPS (number) | OCCURRENCE (%) |
|---|---|---|
| 6.3–7.9 | 990 | 29.36 |
| 7.9–10.0 | 442 | 13.11 |
| 10.0–12.6 | 384 | 11.39 |
| 12.6–15.8 | 239 | 7.09 |
| 15.8–20.0 | 254 | 7.53 |
| 20.0–25.1 | 203 | 6.02 |
| 25.1–31.6 | 168 | 4.98 |
| 31.6–39.8 | 110 | 3.26 |
| 39.8–50.1 | 138 | 4.09 |
| 50.1–63.1 | 106 | 3.14 |
| 63.1–79.4 | 106 | 3.14 |
| 79.4–100.0 | 79 | 2.34 |
| 100.0–125.9 | 64 | 1.90 |
| 125.9–158.5 | 49 | 1.45 |
| 158.5–199.5 | 24 | 0.71 |
| 199.5–251.2 | 12 | 0.36 |
| 251.2–316.2 | 3 | 0.09 |
| 316.2–398.1 | 1 | 0.03 |
|  | 3372 | 100.0 |

TABLE 2

| | TESTS: | | | |
|---|---|---|---|---|
| | 2A | 2B | 2C | 2D |
| PRESSURE (PSI): | 300 | 300 | 300 | 300 |
| CENTERLINE (INCHES): | 4.0 | 4.0 | 4.0 | 4.0 |
| RADIUS (INCHES): | 1.5 | 1.5 | 1.0 | 2.0 |
| AZIMUTHAL ANGLE (%): | 20.6 | 20.6 | 14.0 | 26.6 |
| CYLINDRICAL ANGLE (%): | 270 | 90 | 180 | 0 |

| DIAMETER (microns) | DROPS (number) | OCCURRENCE (%) |
|---|---|---|
| 6.3–7.9 | 958 | 35.04 |
| 7.9–10.0 | 362 | 13.24 |
| 10.0–12.6 | 315 | 11.52 |
| 12.6–15.8 | 208 | 7.61 |
| 15.8–20.0 | 203 | 7.43 |
| 20.0–25.1 | 149 | 5.45 |
| 25.1–31.6 | 123 | 4.50 |
| 31.6–39.8 | 93 | 3.40 |
| 39.8–50.1 | 102 | 3.73 |
| 50.1–63.1 | 73 | 2.67 |
| 63.1–79.4 | 57 | 2.08 |
| 79.4–100.0 | 44 | 1.61 |
| 100.0–125.9 | 21 | 0.77 |
| 125.9–158.5 | 13 | 0.48 |
| 158.5–199.5 | 9 | 0.33 |
| 199.5–251.2 | 4 | 0.15 |
| | 2734 | 100.0 |

TABLE 3

| | TESTS: | | | |
|---|---|---|---|---|
| | 3A | 3B | 3C | 3D |
| PRESSURE (PSI): | 400 | 400 | 400 | 400 |
| CENTERLINE (INCHES): | 4.0 | 4.0 | 4.0 | 4.0 |
| RADIUS (INCHES): | 1.5 | 1.5 | 1.5 | 2.0 |
| AZIMUTHAL ANGLE (%): | 20.6 | 20.6 | 20.6 | 26.6 |
| CYLINDRICAL ANGLE (%): | 270 | 90 | 180 | 0 |

| DIAMETER (microns) | DROPS (number) | OCCURRENCE (%) |
|---|---|---|
| 6.3–7.9 | 735 | 31.09 |
| 7.9–10.0 | 305 | 12.90 |
| 10.0–12.6 | 289 | 12.23 |
| 12.6–15.8 | 196 | 8.29 |
| 15.8–20.0 | 157 | 6.64 |
| 20.0–25.1 | 96 | 4.06 |
| 25.1–31.6 | 102 | 4.31 |
| 31.6–39.8 | 95 | 4.02 |
| 39.8–50.1 | 100 | 4.23 |
| 50.1–63.1 | 97 | 4.10 |
| 63.1–79.4 | 66 | 2.79 |
| 79.4–100.0 | 58 | 2.45 |
| 100.0–125.9 | 39 | 1.65 |
| 125.9–158.5 | 17 | 0.72 |
| 158.5–199.5 | 9 | 0.38 |
| 199.5–251.2 | 3 | 0.13 |
| | 2364 | 100.0 |

TABLE 4

| | TESTS: | | | |
|---|---|---|---|---|
| | 4A | 4B | 4C | 4D |
| PRESSURE (PSI): | 500 | 500 | 500 | 500 |
| CENTERLINE (INCHES): | 4.0 | 4.0 | 4.0 | 4.0 |
| RADIUS (INCHES): | 2.1 | 1.3 | 1.8 | 1.3 |
| AZIMUTHAL ANGLE (%): | 27.7 | 18.0 | 24.2 | 18.0 |
| CYLINDRICAL ANGLE (%): | 0 | 180 | 270 | 90 |

| DIAMETER (microns) | DROPS (number) | OCCURRENCE (%) |
|---|---|---|
| 6.3–7.9 | 757 | 33.99 |
| 7.9–10.0 | 285 | 12.80 |
| 10.0–12.6 | 243 | 10.91 |
| 12.6–15.8 | 167 | 7.50 |
| 15.8–20.0 | 167 | 7.50 |
| 20.0–25.1 | 114 | 5.12 |
| 25.1–31.6 | 102 | 4.58 |
| 31.6–39.8 | 93 | 4.18 |
| 39.8–50.1 | 86 | 3.86 |
| 50.1–63.1 | 82 | 3.68 |
| 63.1–79.4 | 58 | 2.60 |
| 79.4–100.0 | 38 | 1.71 |
| 100.0–125.9 | 27 | 1.21 |
| 125.9–158.5 | 6 | 0.27 |
| 158.5–199.5 | 2 | 0.09 |
| | 2227 | 100.0 |

Figure 8:
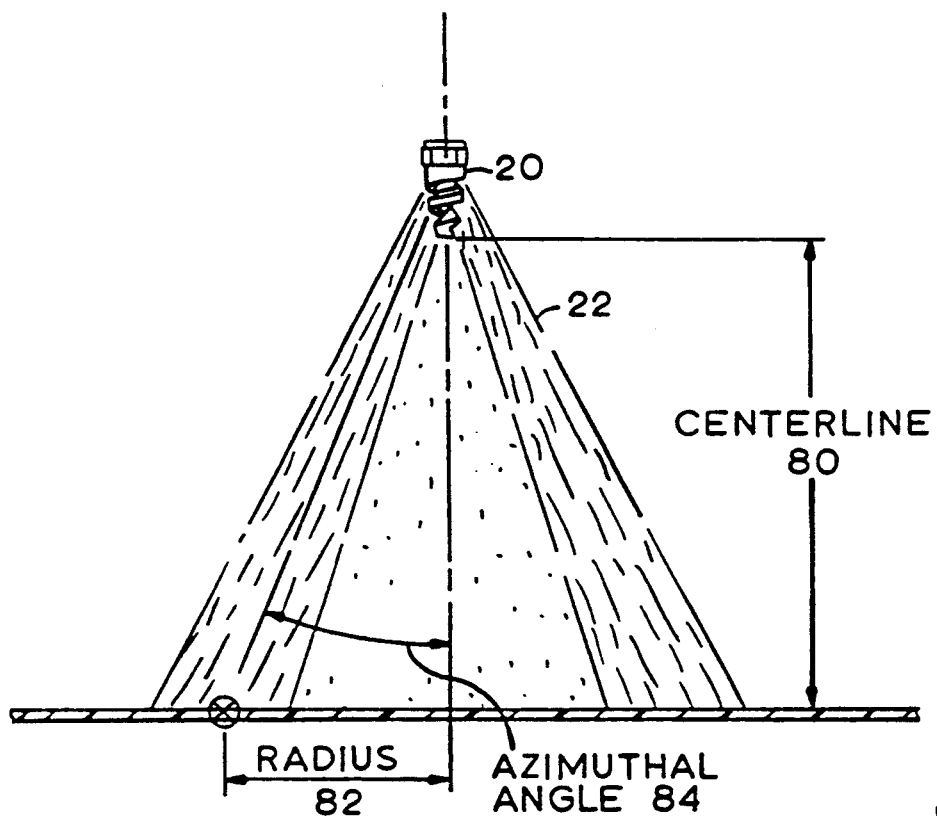
FIG. 8 is a cross-sectional view of a spray pattern relative to a testing location for performance of spray tests.
Figure 9:
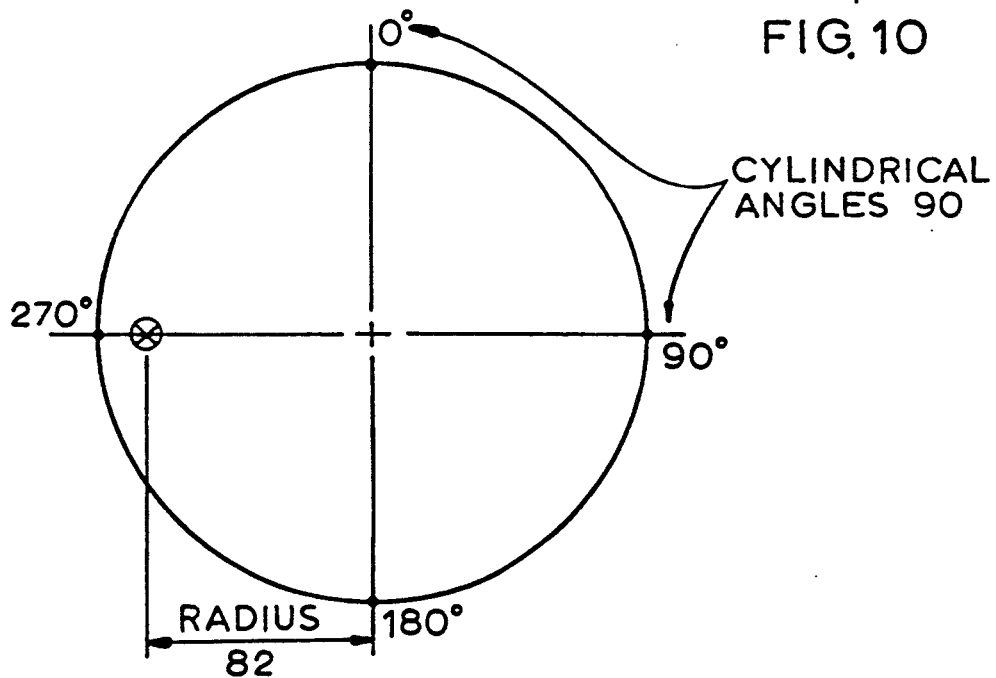
FIG. 9 is a diagrammatic representation of coordinates for purposes of explanation of test results.

The conditions for the droplet size tests included use of a solution composed solely of water pumped at various pressures through a single-turn, helically-vaned nozzle 20 having an included angle of 50°. Centerline 80, radius 82, azimuthal angle 84, and cylindrical angle 90 are additional conditions and variables graphically depicted in FIGS. 8 and 9. Referring to Test 4A as an illustrative example of the testing performed, water is pumped at a pressure of 500 psi through nozzle 20. Centerline 80, which represents the perpendicular distance from nozzle 20 to the printed circuit board 11, is 4.0 inches, while radius 82, the radial coordinate of actual testing and sampling, is 2.1 inches. The azimuthal angle 84 is defined as the included angle from centerline 80 to radius 82 and is 27.7°, while the cylindrical angle 90, the point of measurement around annulus 35 (see FIG. 7) of spray stream 22, is 0°.

Analysis of the test results indicates that more than half (>50%) of the droplets sampled have a diameter between 6.3 and 12.6 microns.

Figure 7:
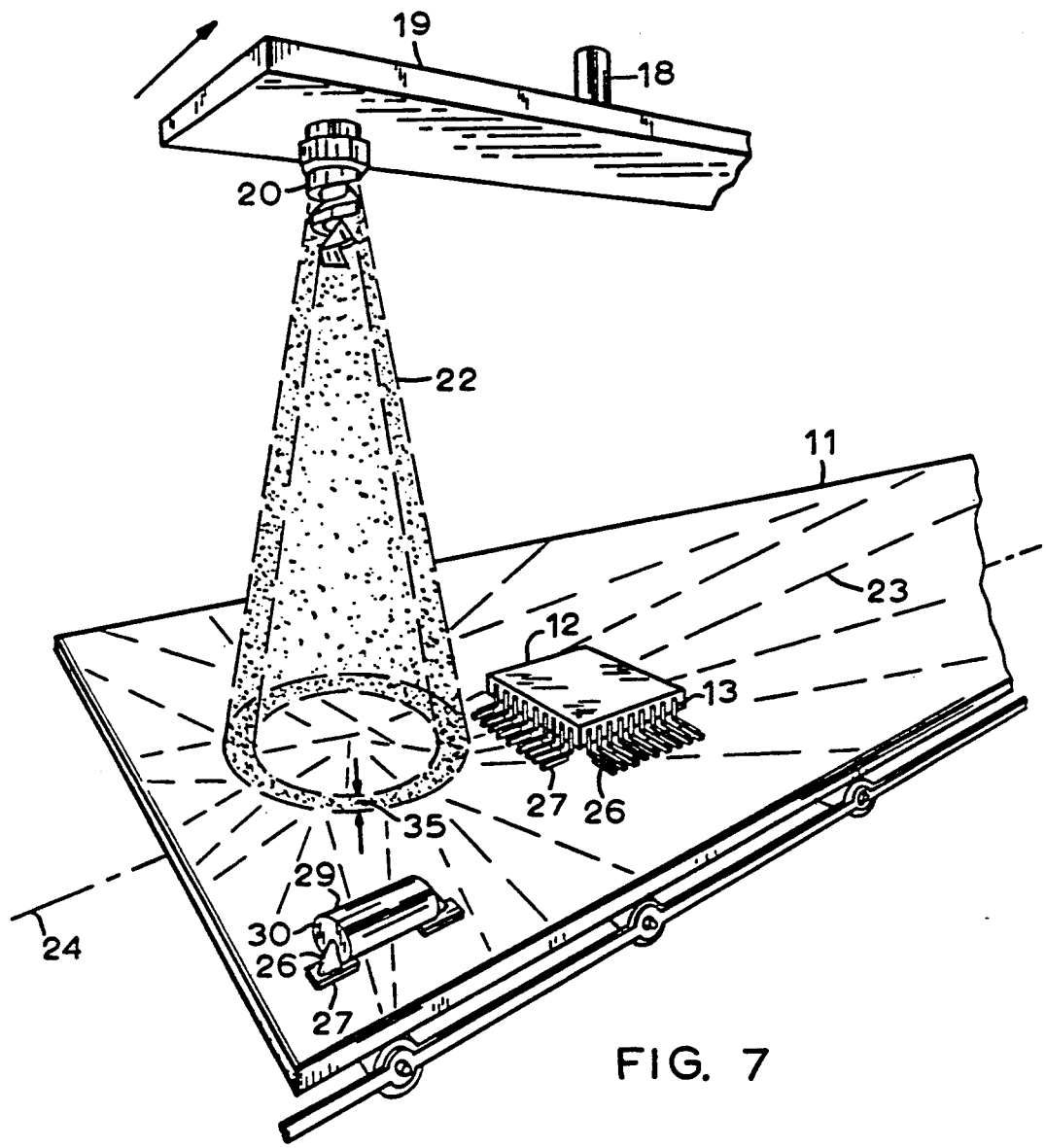
FIG. 7 is a perspective view showing a portion of the solution delivery manifold relative to a printed circuit board surface to diagrammatically illustrate the fluid flow path of the aqueous solution.
Figure 10:
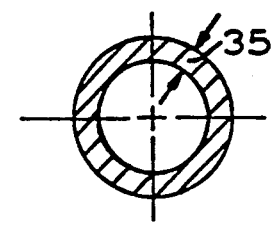
FIG. 10 is a plan diagrammatic view of the annulus formed by the spray pattern of FIG. 8.

Referring now to FIGS. 7 and 10, the spray stream 22 is shown impacting board 11 at an annulus 35. The spray stream 22 may be either full or hollow, that is, the size of the annulus 35 impacting printed circuit board 11 may be either large (i.e. use of a full-cone or two-turn spiral nozzle) or narrow (i.e. use of a hollow-cone or single-turn nozzle). The hollow cone-shaped pattern is preferred for use with surface mounted components. A nozzle found to be satisfactory in the apparatus of the invention is Type TF-N, shown and described on page 17 in Catalog 891 of Bete Fog Nozzle Inc., of Greenfield, MA, which catalog is hereby expressly incorporated by reference as though fully set forth herein. A nozzle of this type is shown and described in U.S. Pat. No. 2,804,341 issued to John U. Bete on Aug. 27, 1957, which patent is also expressly incorporated by reference as though fully set forth herein.

Referring again to FIGS. 1 and 2, the manifold 19 is of a configuration and length to mount a predetermined number of helically-vaned nozzles 20, which may be one or more, and dispense the solution over all areas of the surface of the printed circuit board 11 to achieve thorough cleaning. The nozzles 20 are mounted on the lower outer ends of the manifold 19, and aimed downwardly at the printed circuit board 11. The rotating velocity of the manifold 19 may be adjusted to compensate for a different radius from the center of manifold 19 to the nozzles 20 for proper cleaning spray distribution.

The determination of the number of nozzles 20 to use in the apparatus taught herein will depend on a variety of factors, including cycle speed (time required for cleaning the board 11), overall dimensions of the printed circuit board 11, operating pressure and volumetric discharge capacity of the pump 16, and the heat generating capacity of the reservoir 15. Two or four nozzles have been used successfully, but are not the only numbers which are contemplated to perform within the principles of this invention.

While the cleaning process works well in the range of solution pumping pressure from 250 to 500 psi, in the selection of the actual operating pressure, consideration must be given to the totality of the circumstances. By way of example, excessive pressure could possibly damage delicate substrates or components; low pressure may slow the processing speed or reduce the cleaning quality; and parameters such as pumping capacity, heat generating capacity and number of nozzles must be balanced.

Referring specifically to FIG. 2, the apparatus according to the invention is shown in projection from an observation point of a height between the main sections of the apparatus, that is, the plane of the printed circuit board 11 and the conveyor 14 as well as the underside of the manifold 19 can be seen. This figure shows a manifold 19 of generally elongate configuration having two oppositely disposed radially equidistant nozzles 20. As previously mentioned, the selected number of helically-vaned nozzles 20, the speed of rotation of manifold 19, the speed of movement of conveyor 14, the pressure of solution from the pump 16 and various other parameters are to be balanced to produce optimum results. As an example, the use of two oppositely disposed radially equidistant nozzles 20 facilitates draining of the solution spray stream 22 from an area of impact on printed circuit board 11 before the next rotating spray stream 22 impinges upon that area.

FIG. 7 shows the pattern of the cone-shaped spray stream 22 impacting printed circuit board 11 and thence, in accordance with the principles of the invention, transforming the linear momentum of the high pressure spray stream 22 upon the plane of the surface of board 11 together with certain velocity vectors into an outwardly dispersing, forceful flushing pattern 23 of solution across printed circuit board 11. The resultant flushing pattern 23 is characterized by a changing of the velocity vectors above the plane of the surface of board 11. The geometry of the cone-shaped spray stream 22 is a function of the helically-vaned nozzle 20 used in the cleaning apparatus, which nozzle 20 may be defined by the droplet size of the resultant spray, in addition to the density and impingement angle of the spray upon the surface of board 11.

In accordance with the invention, the velocity vectors are characterized by the geometry of the spray stream 22, the rotation of manifold 19, and the movement of board 11 on the conveyor 14, all of which contribute to an angle of incidence other than 90° perpendicular to the impact of the spray stream 22 upon printed circuit board 11. That is, the combined movement of the manifold 19 and board 11 on the conveyor 14 effects a constantly changing spray direction at the point of impact of the stream 22 with an obstacle, such as hardened flux paste, a lead, or any other obstruction against which debris may lodge.

The combination of the cone-shaped spray geometry and velocity components generates an active cleaning means along the surface of board 11, so that the spray stream 22 is capable of forcibly infiltrating minuscule spaces, such as the clearance between discrete component 29 and printed circuit board 11 and between adjacent leads 13 of integrated circuit component 12, thereby dislodging hardened flux from anywhere on board 11 without the use of solvents. In other words, the flow of the solution, upon impact with board 11, is in a direction parallel to the plane of the printed circuit board 11 and does not follow the "spray and bounce" flow pattern of prior art methods. By overcoming the natural action of a fluid stream impacting a surface at an angle other than a perpendicular angle of 90° to rebound away from that surface, thorough cleaning of the board 11 is permitted, such cleaning being essential to the successful manufacture and production of surface mounted, component-assembled printed circuit boards. At perpendicular angles of approximately 90°, the pressure of a flow stream can effectively reduce the rebound, as demonstrated in the Tardoskegyi patent discussed above. However, velocity and power parallel to the surface to be cleaned is needed to infiltrate minute spaces and dislodge hardened paste flux residue; otherwise, the laterally traveling water merely serves to flood the secondary areas. The combination set forth herein provides such a cleaning means.

The aqueous solution used for the cleaning and dissolving of conventional, surface mount solder flux paste 26 typically includes a solvent to facilitate the removal of residues that are oils and terpenes in nature, a saponification agent to react with the rosin component of the congealed flux residues, and an anti-foaming agent to minimize resultant foam. These chemical additives are normally used in manufacturing and readily available from a variety of commercial sources. An optimum solution effectiveness is obtained by applying the additives (in concentrate form) in the order of 3 to 7 percent of the total aqueous solution at an operating temperature of 155°±5° F. Although alternative cleaning fluids may be used, water based solutions are found to be least damaging environmentally and highly desirable. Use of this invention for chlorofluorocarbon based solutions should work well, but the inventors believe a feature of the invention lies in obviating the need to use such solvents for cleaning.

In a presently preferred embodiment of the invention, the aqueous solution contains 7% concentrate, which includes a solvent, a saponification agent and an anti-foaming agent, and 93% water heated to a temperature of about 155° F. The solution is pumped at a pressure of 500 psi and delivered to the manifold 19 having two helically-vaned nozzles 20 that generate a hollow cone-shaped spray stream 22 of about 50° included angle directed at the surface of printed circuit board 11. The manifold 19 is rotated in a counter-clockwise direction (viewed from above) at a rate of twenty rpm and at a height of about four inches above the surface to be cleaned. Printed circuit board 11 is moved by a conveyor 14 traveling at a speed of about three feet per minute.

While there has been shown and described a preferred embodiment, it is to be understood that various other adaptations and modifications may be made within the spirit and scope of the invention. It is to be understood that although the preceding description has proceeded with reference to a printed circuit board having components mounted on one surface thereof, the invention is equally applicable to a process for the cleaning of a printed circuit board 11 which has components 12 and 29 mounted on both surfaces thereof. For such double sided surface mounted boards 11, the cleaning of both sides can be accomplished within the teaching of this invention by duplicating the fluid delivery arrangement (both above and below the board) and utilizing a conveyor means 14 which supports the printed circuit board 11 at its edges only, leaving the main upper and lower surface areas clear for solution impingement.

Additionally, the invention is applicable to water-soluble solder paste used for the surface mounting of components upon printed circuit boards. In this case particularly, water may be the preferred cleaning fluid within the teaching of this invention.

What is claimed is:

1. Apparatus for cleaning a printed circuit board having surface-mounted components on a surface thereof, said apparatus comprising:

means for pressurizing a liquid cleaning fluid;
   fluid delivery means for accepting said pressurized fluid from said pressurizing means, said fluid delivery means configured, dimensioned and arranged to rotate in a plane generally parallel to the plane of said printed circuit board;
   nozzle means for receiving said fluid from said fluid delivery means and delivering a cone-shaped fluid spray of highly atomized droplets to the surface of said printed circuit board, said nozzle means attached to said fluid delivery means at a predetermined distance from the rotational axis of said fluid delivery means, whereby rotation of said fluid delivery means imparts a direction of travel to said spray, and
   conveyor means for transporting said printed circuit board in a plane perpendicular to the axis of rotation of said fluid delivery means,
   whereby said fluid spray is dispensed over all areas of the surface of said circuit board as it impacts the surface from a direction other than perpendicular to the surface of said circuit board and a flushing pattern of said fluid is created over and under the surface-mounted components on the surface to achieve thorough cleaning of the circuit board surface.

2. The apparatus of claim 1 wherein said nozzle means is a helically-vaned nozzle and wherein more than half of said droplets have a diameter between 6.3 and 12.6 microns.

3. The apparatus of claim 2 wherein said cone-shaped spray is hollow.

4. The apparatus of claim 3 wherein said fluid delivery means includes a generally elongate manifold having an inlet, a rotatable pressure seal attached to said inlet, and motor means connected to said inlet, said motor means capable of rotating or oscillating said manifold about said inlet.

5. The apparatus of claim 4 wherein said pressurizing means is a pump.

6. The apparatus of claim 1 wherein said fluid is water.

7. The apparatus of claim 1 wherein said fluid is an aqueous solution of water and a saponification agent.

8. The apparatus of claim 5 further comprising reservoir means for containing and heating said fluid, said reservoir means connected to said pressurizing means.

9. A method for cleaning a printed circuit board having surface-mounted components on a surface thereof comprising the steps of:

pressurizing a fluid;
   producing a cone-shaped pressurized fluid spray stream of highly atomized droplets having an included angle between 50° and 90°;
   imparting a rotational velocity to said pressurized fluid spray stream;
   delivering said fluid spray stream to the surface of said printed circuit board; and
   disposing said printed circuit board such that said fluid spray stream impacts the surface of said printed circuit board at an angle of incidence other than 90 degrees perpendicular to said board and an outwardly flushing pattern of said fluid is created over the surface of said board.

10. The method of claim 9 wherein said delivery of said fluid spray stream is by means of a helically-vaned nozzle.

11. The method of claim 10 wherein said imparting of said rotational velocity is by means of a rotating delivery manifold.

12. The method of claim 11 wherein said transporting of said printed circuit board is by means of a conveyor traveling in a plane parallel to the plane of said rotating delivery manifold.

13. Apparatus for cleaning a printed circuit board having surface-mounted components on a surface thereof comprising:

means for pressurizing an aqueous solution;
   nozzle means configured, dimensioned and arranged for producing a cone-shaped spray stream of said pressurized solution having an included angle of 50° to 90° and delivering said solution spray stream to the surface of said printed circuit board, said cone-shaped spray having a generally annular configuration of highly atomized droplets;
   solution delivery means for accepting said pressurized solution from said pressurizing means and delivering said solution to said nozzle means, said solution delivery means configured, dimensioned and arranged to rotate in a plane generally parallel to the plane of said printed circuit board so as to impart a rotational velocity to said pressurized solution spray stream; and
   conveyor means for transporting said printed circuit board in a plane perpendicular to the axis of rotation of said solution delivery means such that dispersion of said solution spray stream on impact with the surface of said printed circuit board results in a flushing pattern of said solution in a direction generally parallel to the plane of said board thereby enabling cleaning of all areas of the surface of said printed circuit board.

14. Apparatus for the aqueous cleaning of a populated printed circuit board comprising:

a heated reservoir capable of containing and heating an aqueous solution;
   a pump connected to said reservoir, said pump capable of pressurizing said solution;
   a generally elongate delivery manifold rotatable about its approximate geometrical center axis and configured for accepting said pressurized solution from said pump, said manifold having an inlet, a rotatable pressure seal attached to said inlet, and a direct drive gear motor;
   a helically-vaned nozzle configured for receiving said solution from said delivery manifold and delivering said spray to said printed circuit board, said nozzle attached to said delivery manifold at a predetermined distance from the rotational axis of said manifold, said nozzle further configured for producing a hollow, cone-shaped solution spray of highly atomized droplets for dispersion over all areas of said populated printed circuit board, wherein more than half of said droplets have a diameter between 6.3 and 12.6 microns; and a conveyor configured for transporting said populated printed circuit board in a plane perpendicular to the axis of rotation of said manifold, resulting in a flushing pattern of said solution in a direction generally parallel to the plane of said board and enabling cleaning of all areas of said populated printed circuit board.

* * * * *

UNITED STATES PATENT AND TRADEMARK OFFICE
CERTIFICATE OF CORRECTION

PATENT NO. : 5,129,956

DATED : July 14, 1992

INVENTOR(S) : Pickering, et al

It is certified that error appears in the above-identified patent and that said Letters Patent is hereby corrected as shown below:

On the title page, Item [75] Inventors should read as follows:
--Raymond E. Pickering, Vassalboro, Me.; Patricia E. Waitkus, Rockport, Mass.; David C. Gorey, Northboro, Mass.; Delmar R. Parsons, Greenfield, Mass.; Lincoln Soule, Wendell, Mass.; William F. Walker, South Deerfield, Mass.; Robert E. Bedaw, Turner Falls, Mass.--.

Signed and Sealed this

Twenty-first Day of September, 1993

Attest:

BRUCE LEHMAN

Attesting Officer

Commissioner of Patents and Trademarks